(12) United States Patent
Sathrum

(10) Patent No.: US 9,624,570 B2
(45) Date of Patent: Apr. 18, 2017

(54) COMPACT, FILTERED ION SOURCE

(71) Applicant: Fluxion Inc., Eureka Springs, AR (US)

(72) Inventor: Paul Erik Sathrum, Eureka Springs, AR (US)

(73) Assignee: FLUXION INC., Eureka Springs, AR (US)

( * ) Notice: Subject to any disclaimer, the term of this patent is extended or adjusted under 35 U.S.C. 154(b) by 482 days.

(21) Appl. No.: 13/763,994

(22) Filed: Feb. 11, 2013

(65) Prior Publication Data

US 2013/0206585 A1 Aug. 15, 2013

Related U.S. Application Data

(60) Provisional application No. 61/596,868, filed on Feb. 9, 2012.

(51) Int. Cl.
*C23C 14/00* (2006.01)
*C23C 14/32* (2006.01)
*C23C 14/56* (2006.01)

(52) U.S. Cl.
CPC .......... *C23C 14/325* (2013.01); *C23C 14/564* (2013.01); *H01J 2237/15* (2013.01); *H01J 2237/3142* (2013.01)

(58) Field of Classification Search
CPC ................................................. H01J 37/32055
See application file for complete search history.

(56) References Cited

U.S. PATENT DOCUMENTS

| 4,452,686 | A |   | 6/1984  | Axenov et al. |              |
|-----------|---|---|---------|---------------|--------------|
| 4,710,283 | A | * | 12/1987 | Singh ........ | H01J 37/08   |
|           |   |   |         |               | 204/298.01   |
| 4,845,041 | A |   | 7/1989  | Scuitto et al.|              |
| 4,911,814 | A | * | 3/1990  | Matsuoka .... | C23C 14/357  |
|           |   |   |         |               | 204/192.12   |

(Continued)

FOREIGN PATENT DOCUMENTS

WO          96-16426 A1    5/1996

OTHER PUBLICATIONS

International Search Report and Written Opinion for International Patent Application No. PCT/US2013/025626, mailed Jun. 2, 2013.

(Continued)

*Primary Examiner* — Keith Hendricks
*Assistant Examiner* — Timon Wanga
(74) *Attorney, Agent, or Firm* — Mark P. Walters; Lowe Graham Jones PLLC

(57) ABSTRACT

The present invention relates to a filtered cathodic-arc ion source that reduces, or even eliminates, macroparticles while minimally compromising the compact size, simplicity, and high flux ion production benefits of unfiltered cathodic-arc sources. Magnetic and electrostatic forces are implemented in a compact way to guide ions along curved trajectories between the cathode source and the workpiece area such that macroparticles, which are minimally affected by these forces and travel in straight lines, are inhibited from reaching the workpieces. The present invention implements this filtering technique in a device that is compact, symmetrical and easy to manufacture and operate and which does not substantially compromise coating deposition rate, area, or uniformity.

3 Claims, 18 Drawing Sheets

(56) References Cited

U.S. PATENT DOCUMENTS

| | | | |
|---|---|---|---|
| 4,929,321 A | | 5/1990 | Buhl |
| 5,279,723 A | | 1/1994 | Falabella et al. |
| 5,282,944 A | * | 2/1994 | Sanders et al. .......... 204/192.38 |
| 5,317,235 A | * | 5/1994 | Treglio .................... 315/111.41 |
| 5,458,754 A | | 10/1995 | Sathrum et al. |
| 5,840,163 A | | 11/1998 | Welty |
| 6,756,596 B2 | | 6/2004 | Sathrum |
| 2003/0193031 A1 | * | 10/2003 | Sathrum ....................... 250/426 |
| 2006/0177599 A1 | * | 8/2006 | Madocks ................ C23C 14/32 427/569 |
| 2007/0187229 A1 | | 8/2007 | Aksenov et al. |

OTHER PUBLICATIONS

Anders, S., et al., "S-Shaped Magnetic Macroparticle Filter for Cathodic Arc Deposition"; IEEE Transactions on Plasma Science; 25(4):670-674; Aug. 1997.

Kwok, D. T.-K., et al., "Ion Mean Charge State in a Biased Vacuum Arc Plasma Duct"; IEEE Transactions on Plasma Science; 28(6):2194-2201; Dec. 2000.

Martin, P.J., and Bendavid, A., "Ionized Plasma Vapor Deposition and Filtered Arc Deposition; Processes, Properties and Applications"; Journal of Vacuum Science & Technology; A 17(4):2351-2359; Jul.Aug. 1999.

Sanders, D.M., et al., "Coating Technology Based on the Vacuum Arc—A Review"; IEEE Transactions on Plasma Science; 18(6):883-894; Dec. 1990.

\* cited by examiner

COMPACT, FILTERED ION SOURCE

CROSS-REFERENCE TO RELATED APPLICATIONS

This non-provisional patent application claims the benefit under 35 U.S.C. §119(e) of U.S. Provisional Patent Application Ser. No. 61/596,868 filed on Feb. 9, 2012, entitled "Compact Filtered Ion Source," which is incorporated herein by reference.

FIELD OF THE INVENTION

This invention relates generally to an ion source, and more specifically to a filtered ion source for use in a variety of ion applications where efficient ion transport and macroparticle filtering from a simple, compact device is desired.

BACKGROUND OF THE INVENTION

Ion sources are used in a variety of applications, from heat treatments to physical vapor deposition ("PVD") of materials onto workpieces. Typically, the ion source material is consumed to produce the vapor, which also results in the transmission of undesirable chunks or droplets called macroparticles. Macroparticles are undesirable for nearly all ion source applications, especially those applications involving PVD. The PVD equipment industry serves a ten billion dollar market.

Frequently, PVD techniques using an electric arc, specifically cathodic arc, are preferable over other PVD deposition methods due to the production of copious numbers of ions. The production of a highly ionized plasma combined with the use of electrically biased workpieces, may allow the arrival energy of the ions to be controlled during deposition, thereby providing for optimization of important film properties such as stoichiometry, adhesion, density, and hardness or, for example, controlling the uniform buildup of coating inside of trenches and vias on computer chips. As another example, the hardness of diamond-like-carbon (DLC) films deposited using cathodic arc evaporation have been shown to be four times harder than DLC films deposited using non-ionized methods, approaching the hardness of natural diamond. A second primary reason, in addition to high ion flux, that cathodic arc sources have been widely adopted commercially (for applications that are relatively insensitive to macroparticles, such a cutting tool coatings), is that they are relatively robust, compact and simple devices.

Notwithstanding the noted benefits of PVD using a cathodic arc, this deposition technique also produces undesirable macroparticles. These chunks or droplets of source material lead to blemishes in the coatings and exclude unfiltered or poorly filtered cathodic-arc ion sources from use in applications requiring smooth films such as optical, electronic (e.g. computer chip, battery, solar) or data storage coatings (e.g. computer hard drive). Applications less sensitive to macroparticle contamination such as cutting tool coatings have also been shown to benefit from filtered deposition because macroparticles that become incorporated into the coating can fall out during cutting operation, opening a hole through the coating, which can lead to coating failure. Furthermore, filtered, pure ion deposition produces films with properties that are superior to unfiltered cathodic arc films, providing benefits in addition to macroparticle elimination.

Despite known prior art efforts to eliminate the transmission of macroparticles, techniques of the prior art (commonly referred to as "filtering") appear unable to eliminate macroparticles without significantly compromising the compact size, simplicity, and high flux ion production benefits of unfiltered cathodic-arc sources. Coating deposition rate, distribution area, and uniformity may be significantly reduced in prior art devices. In addition, the filtering equipment that is generally added to the cathodic arc source is typically large in size, non-symmetrical, complex and expensive to manufacture. Also, despite significant effort, at least some macroparticles may pass through prior art filters, which is a problem when extremely smooth films are required—in computer disc, electronic or optical applications, for example. This may be particularly problematic when depositing diamond-like-carbon films produced by evaporating graphite. Macroparticles produced from metal cathodes are typically liquid and do not bounce but adhere to the first surface they encounter. In contrast, macroparticles produced during the evaporation of graphite are solid, elastic and energetic, and can be reflected numerous times from surfaces within a filter. (Other materials such as silicon also produce hard, elastic macroparticles.) Even with no line-of-sight between the source material and the workpieces and the presence of baffling to catch them, elastic macroparticles, may be reflected numerous times from surfaces within a filter and reach workpieces.

BRIEF DESCRIPTION OF THE DRAWINGS

Non-limiting and non-exhaustive embodiments of the present invention are described with reference to the following figures. In the figures, like reference numerals refer to like parts throughout various figures unless otherwise specified. For a better understanding of the present invention, reference will be made to the following Detailed Description, which is to be read in association with the accompanying figures, wherein.

DETAILED DESCRIPTION

Figure 1A:
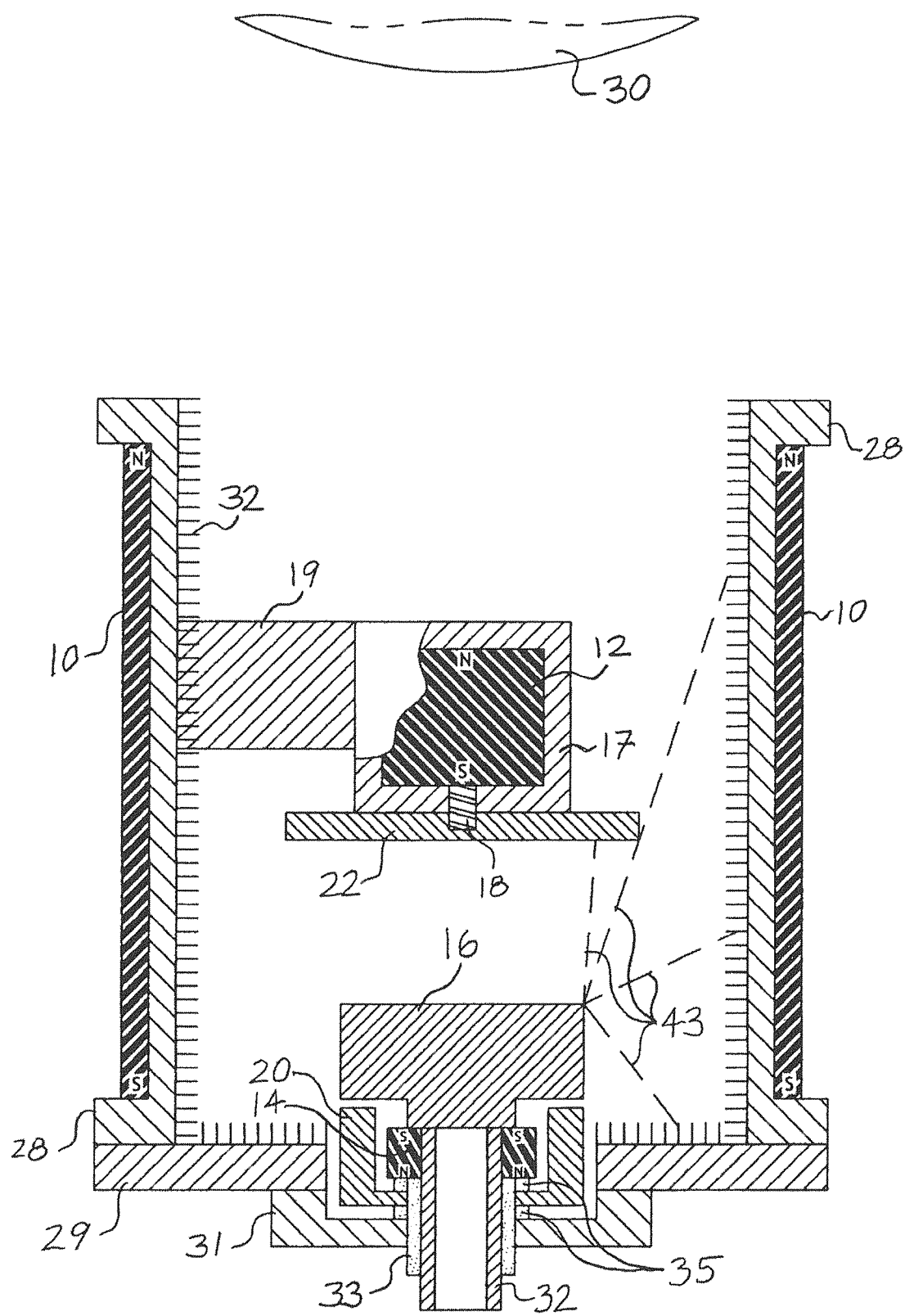
FIG. 1A is a schematic cross-sectional planar view of an ion source useable with the present invention.

Throughout the specification and claims, the following terms take the meanings explicitly associated herein, unless the context clearly dictates otherwise. The phrase "in one embodiment" as used herein does not necessarily refer to the same embodiment, though it may. Furthermore, the phrase "in another embodiment" as used herein does not necessarily refer to a different embodiment, although it may. Additionally, the phrase "in some embodiments" may refer to one or more embodiments and does not necessarily refer to the same embodiment, although it may. Thus, as described below, various embodiments of the invention may be readily combined, without departing from the scope or spirit of the invention.

In addition, as used herein, the term "or" is an inclusive "or" operator, and is equivalent to the term "and/or," unless the context clearly dictates otherwise. The term "based on" is not exclusive and allows for being based on additional factors not described, unless the context clearly dictates otherwise. In addition, throughout the specification, the meaning of "a," "an," and "the" include plural references. The meaning of "in" includes "in" and "on."

Furthermore, as used herein, the term "aligned" when referring to two vector quantities signifies that the two vector quantities are pointing in substantially the same direction. Likewise, the term "anti-aligned" when referring to two vector quantities signifies that the two vector quantities are pointing in substantially opposite directions. Anti-aligned may be used interchangeable with terms such as "in opposition", "opposing", "opposite" and the like.

The following briefly describes embodiments of the invention in order to provide a basic understanding of some aspects of the invention. This brief description is not intended as an extensive overview. It is not intended to identify key or critical elements, or to delineate or otherwise narrow the scope. Its purpose is merely to present some concepts in a simplified form as a prelude to the more detailed description that is presented later.

The present invention relates to an apparatus and method for use in combination with an electric arc vapor deposition system (or any other ion source application where macroparticle filtering is desired) that substantially eliminates macroparticles, maintains the simplicity and high ion flux advantages of unfiltered cathodic arc without substantially compromising coating deposition rate, area or uniformity.

Briefly stated, the various embodiments described herein relate to the use of the present invention in a physical vapor deposition system using the cathodic arc. The present invention is not limited to deposition of materials on workpieces but rather, the macroparticle filtering aspect of the present invention has several uses in addition to deposition. For example, efficient macroparticle filtering enables an arc ion source to function as a high intensity electron source for heating workpieces prior to coating. Additionally, this high electron density source is able to be used for excitation and ionization of vapor produced by an auxiliary evaporation source. When operating in such a mode, high intensity and low energy electron streams are capable of being produced. This heating capability may be exploited as a means for vacuum degassing components, surface annealing or other vacuum heat treatments. The present invention is not limited to use as a deposition system and may be employed in any situation where efficient filtering of macroparticles from ions is beneficial. Furthermore, filtering effects may be increased by employing multiple instances of filters. In some embodiments, multiple filters may be arranged serially. In some embodiments, multiple filters may be arranged in a parallel configuration. In some embodiments, multiple filters may be arranged in a combination of series and parallel configurations.

Furthermore, some of the embodiments described herein relate to deposition systems using consumable cathode materials. One of ordinary skill in the art will appreciate that the present invention is not limited by the charge assigned to the source material. Examples of deposition systems using consumable cathode materials can be found in, for example, U.S. Pat. No. 6,756,596, which is incorporated by reference.

Referring to FIG. 1A, a magnetic field may be produced by the relative arrangement of Outer Magnet 10, Inner Magnet 12 and Cathode Magnet 14. The Outer Magnet 10 and Inner Magnet 12 may be arranged in a concentric fashion. Outer Magnet 10 may be a neodymium-iron-boron type permanent magnet or magnets. Inner Magnet 12 and Cathode Magnet 14 may be heat-resistant samarium-cobalt type permanent magnets. Inner Magnet 12 may be held within Center Housing 17, which is connected to Filter-Duct 28 by Fin 19. Filter-Duct 28, Fin 19 and Center Housing 17 may be constructed of non-magnetic stainless steel or aluminum for example, and may be water cooled, which is not shown. Although a single fin, Fin 19 is shown, two or more fins may be used to position Center housing 17. End Plate 29 may be attached to Filter-Duct 28 with a vacuum seal such as an oring, gasket, or "conflate" type seal—not shown. Cathode Plate 31 may likewise be attached to End Plate 29 using similar vacuum sealing. The other, open end of Filter-Duct 28 may be attached to the vacuum chamber, not shown, again using vacuum sealing. Cathodic arc vacuum chambers are known in the art and thus the details and construction of the chamber itself will not herein be described. The vacuum chamber (not shown), Filter Duct 28, End Plate 29 and Cathode Plate 31 may be electrically connected, earth grounded and connected to the positive terminal of the arc power supply (not shown), although in other embodiments, any of these may be electrically isolated from each other and/or from ground. The negative terminal of the arc power supply is connected to Cathode 16. Cathode 16 may be a cylinder two and one half inches (or any other appropriate dimension) in diameter and may be of any material including carbon, silicon or metals such as titanium, chromium, aluminum, vanadium, zirconium, tantalum, copper, stainless steel, and niobium. Power to the cathode may be direct current or pulsed. Cathode Stem 32 may act to feed power and water cooling to Cathode 16. Cathode Stem 32 may be electrically isolated from Cathode Plate 31 by Cathode Insulator 33, which also may provide a vacuum tight seal by means such as brazing. If the arc wanders to the bottom of the cathode, it may be extinguished without causing damage because Cathode Shield 20 is floating electrically and the arc does not have a route to the anode via Cathode Shield 20. In normal operation the arc may have a route from the cathode through the electrically conductive plasma to the anode when the arc is running on the "top" or side surfaces of the cathode, which are the desire working surfaces. ("Top" hereafter refers to the surface of Cathode 16 that faces Inner Magnet 12.) Cathode Shield 20 may be electrically isolated by Cathode Shield Insulators 35. Cathode Shield 20 may act to protect non cathode surfaces such as Cathode Magnet 14 from damage from improper arcing. During development, improper arcing sometimes is a problem, but in at least one embodiment of the present invention, the arrangement of magnets and cathode, described herein, operation without Cathode Shield 20 is possible. All other surfaces besides Cathode Shield 20 within the duct-filter (including: Filter-Duct 28, Macroparticle Blocker 22, Baffling 32, End Plate 29 and Cathode Plate 31) may be electrically earth grounded and connected to the positive terminal of the arc power supply (not shown) and may act as the anode, which the arc "sees" when operating on the other surfaces of the cathode, thereby providing for arc stability. In alternative embodiments not shown, Macroparticle Blocker 22, Baffling 32, End Plate 29 and Cathode Plate 31 may be electrically isolated individually or together, to assist in arc control or to improve ion-throughput.

Figure 1D:
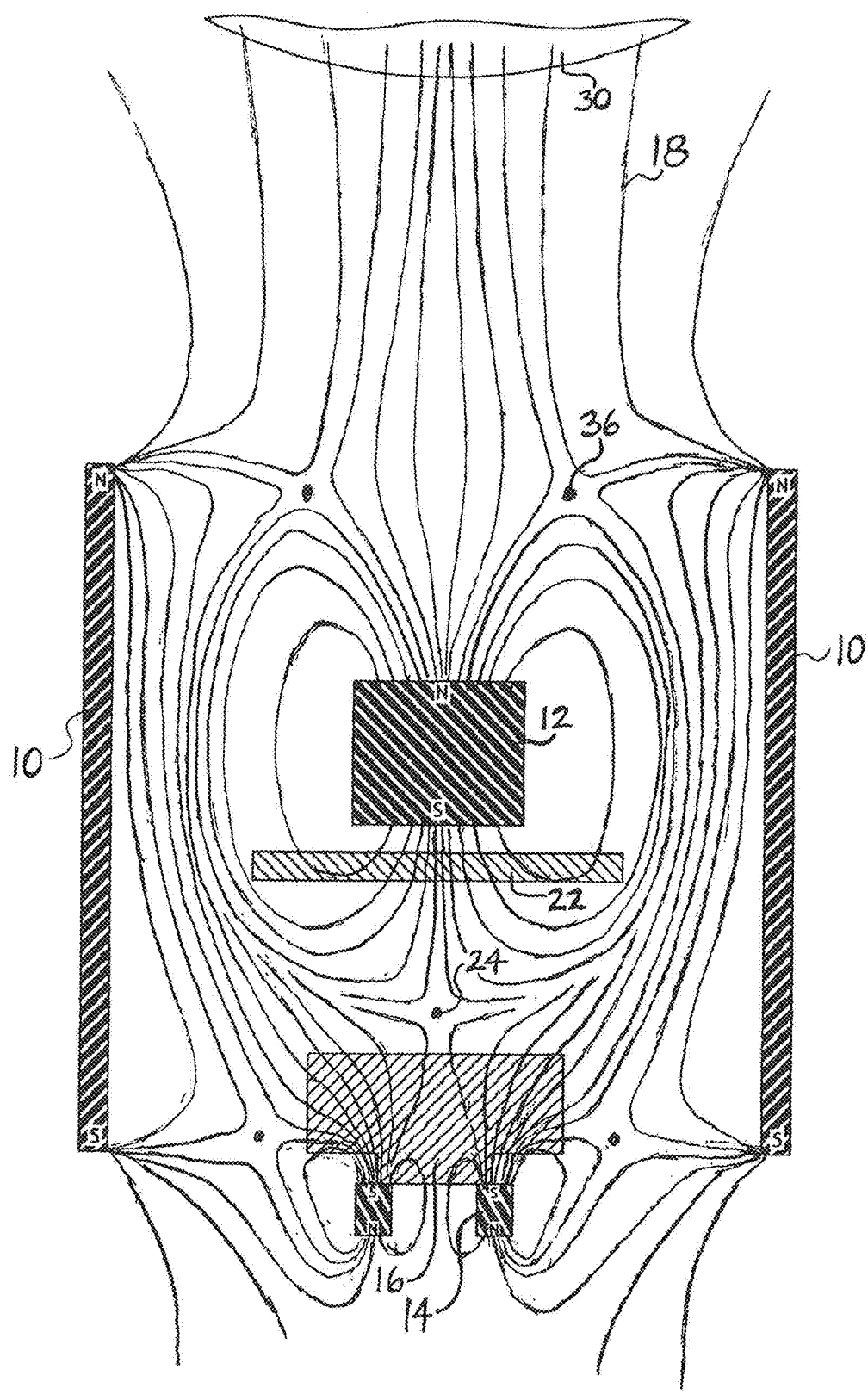
FIG. 1D illustrates the magnetic field created by the embodiment depicted in FIG. 1A.
Figure 2A:
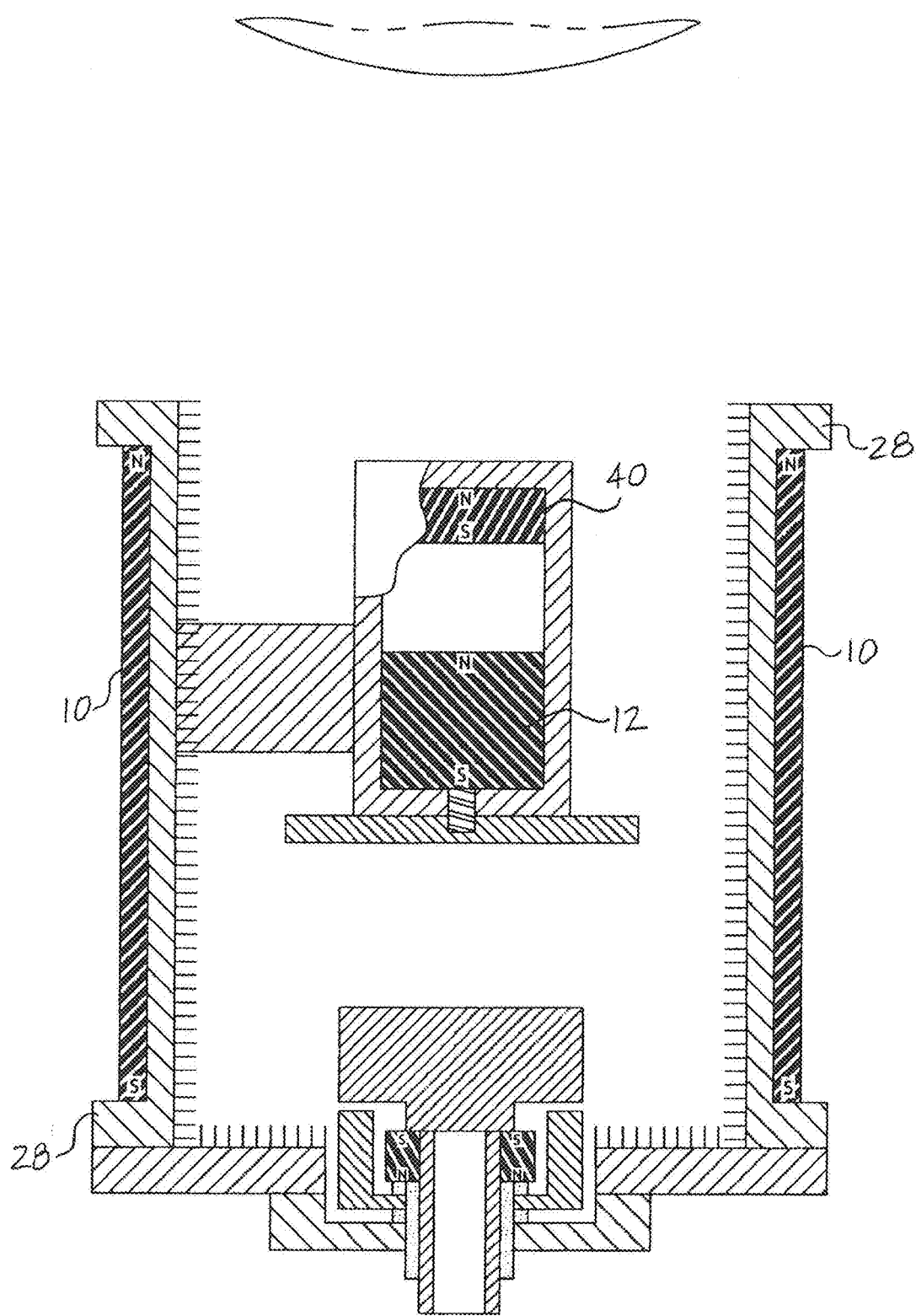
FIG. 2A is a schematic cross-sectional planar view of another embodiment useable with the present invention, showing the addition of a magnet near the exit for modifying the size of the deposition area.
Figure 2B:
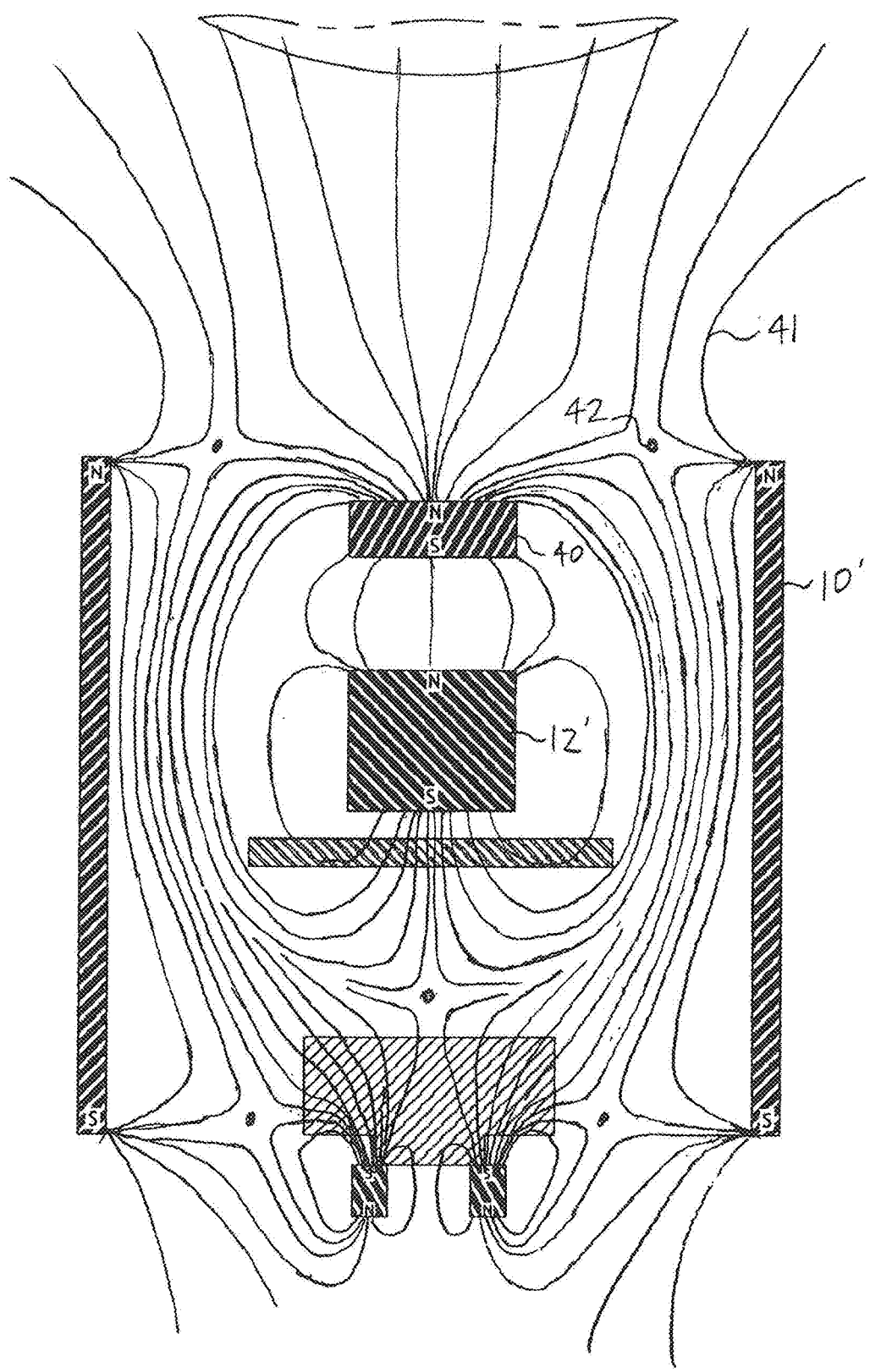
FIG. 2B illustrates the magnetic field created by the embodiment depicted in FIG. 2A.

The present invention may utilize permanent magnets, rather than magnet coils (electro-magnets). Permanent magnets have an associated vector quantity, magnetic moment that determines the force that the magnet can exert on electric currents and the torque that the induced magnetic field will exert on the current. The shape of the magnetic field produced by permanent magnets is fundamentally different than the shape produced by coils and all operational aspects of ion sources are sensitive to the shape of the magnetic field (as described herein). An example of this fundamental difference is the polarity of permanent Magnets 10 and 12, which are in the same direction in the present invention. In other words, the magnetic moments of permanent Magnets 10 and 12 are aligned. Also, permanent magnets have an associated north pole and south pole: magnetic field lines enter the poles of the permanent magnets (as can be seen in FIGS. 1D and 2B). The direction of the magnetic moment of a permanent magnet is aligned with a vector that points from the south pole to the north pole of the permanent magnet.

FIG. 1A illustrates how macroparticles 43, depicted by dashed lines, originating at Cathode 16, are prevented from reaching Workpiece Area 30 by Macroparticle Blocker 22 and Baffling 32. Although only a few macroparticles are illustrated for clarity, in actuality macroparticles are emitted in copious quantities in all directions with substantially line-of-sight trajectories from the arc spot on the cathode surface. (It should be noted that the present invention may be operated without Baffling 32 and/or Macroparticle Blocker 22, in which case the walls of Filter duct 28 and Center Housing 17 may act to intercept macroparticles.) Macroparticle Blocker 22 may be attached to Center Housing 17 by Threaded Stud 18. Workpieces may be arranged in workpiece area 30 and may be mounted in a holder or fixture and rotated within workpiece area 30 to provide uniformity in coating and the availability of coating a large number of workpieces. Macroparticle Blocker 22 and Baffling 32 may be made of materials such as graphite or high temperature metal honeycomb. An additional benefit is that Macroparticle Blocker 22 and Baffling 32 may be easily removed for replacement or cleaning of coating buildup, simplifying a maintenance task that is necessary for all types of coating sources.

Figure 1B:
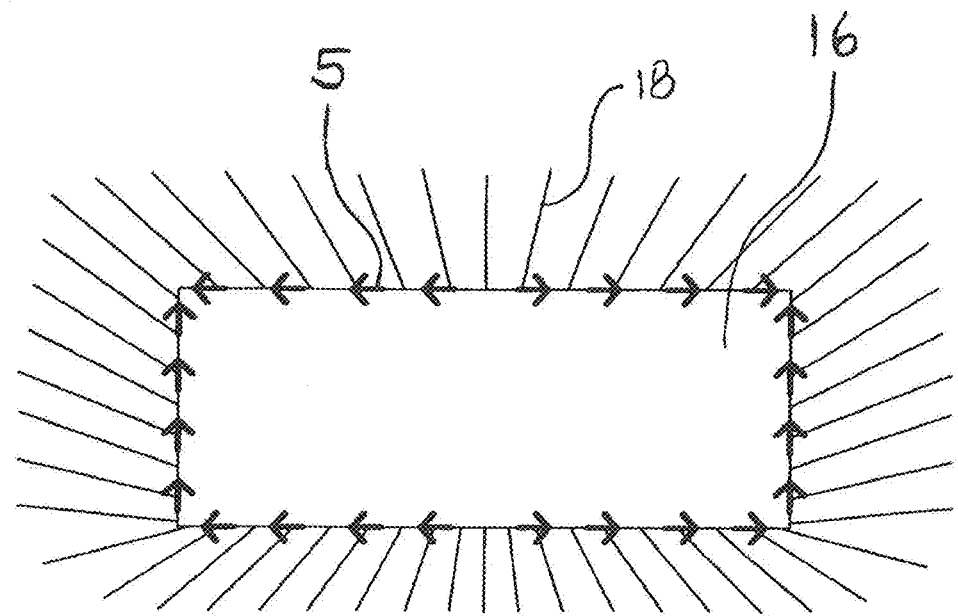
FIGS. 1B and 1C are schematic cross-sectional planar views of a cylindrical cathode electrode in the magnetic field of the present invention.
Figure 1C:
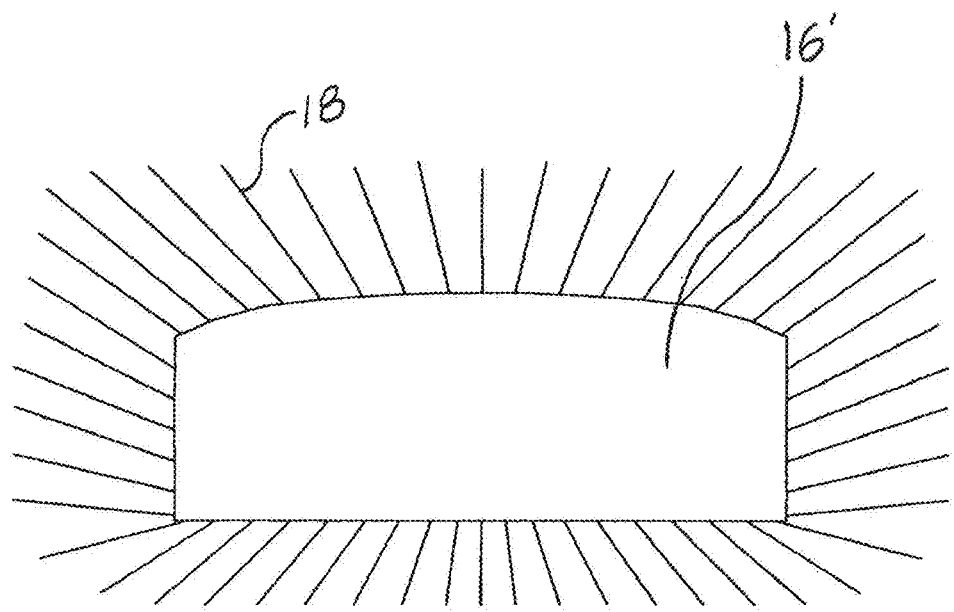

Arc stability and maximal cathode erosion may be provided by tailoring the shape of the magnetic field to cause the arc to be contained on the top surface of Cathode 16, as shown in FIG. 1B. The arc appears as an intensely bright arc spot or spots on the cathode. Multiple spots may occur simultaneously on the cathode, depending on arc current and material. The arc (as an arc spot or spots) moves towards the acute angle created between the magnetic field line and the surface of the cathode. This is schematically shown in FIG. 1B where Arrows 5 indicate the direction that the arc is forced by Magnetic Field Lines 18. As can be seen, the arc is directed towards and maintained on the top surface of Cathode 16. During initial operation using a new cathode with a shape like Cathode 16 in FIG. 1B, the arc prefers the outer edge of the top surface of the cylindrical cathode, circling around there, but spreads out over the top surface as the edge is eroded, such that the magnetic field lines become more perpendicular to the cathode erosion surface, ultimately producing a top surface as illustrated by Cathode 16' in FIG. 1C. Maximal cathode erosion/usage is thus provided for because the erosion pattern shown in FIG. 1C is maintained as the cathode is eroded down further and much of the volume of Cathode 16 is therefore used before it must be discarded. The strong magnetic field produced at the cathode also forces the arc spot or spots to travel at high velocity, which results in fewer macroparticles being produced at the arc spots. Macroparticles are reduced at their source by causing the arc to move, which is accomplished without a complicated and bulky arc steering apparatus.

FIG. 1D demonstrates how the arc stabilizing magnetic field schematically shown in FIGS. 1B and 1C may be achieved in actual practice. Cathode Magnet 14 may be positioned below Cathode 16 with its polarity reversed relative to Outer Magnet 10 and Inner Magnet 12 and acts to modify the angle of Magnetic Field Lines 18 at the surface of Cathode 16. In other embodiments not shown, Cathode Magnet 14 may be placed in a different position behind Cathode 16, even outside the vacuum chamber in atmosphere, and may be of a different size or shape. (Furthermore, it should be noted that stable arc operation without Cathode Magnet 14 is possible, for example, by extending Outer Magnet 10 further past the bottom end of Cathode 16. Also, cathode magnet 14 could be a magnet coil or a magnet pole piece, for example, made of soft iron or low carbon steel.) The arrangement of Magnets 10, 12 and 14 creates Null Point 24 where the magnetic field lines from Outer Magnet 10 and Inner Magnet 12 meet with opposite polarity, creating a point of zero magnetic field strength. The operation of the present invention depends on the location of Cathode 16 relative to Null Point 24. In one embodiment shown in FIG. 1D, the cathode is positioned below Null Point 24 to provide the arc stability and maximal cathode erosion benefits described herein. (Plus the ion-throughput benefits described below). If Cathode 16 is positioned above Null Point 24, the arc may be forced to the top-center of Cathode 16 where it may erode a bowl. This may result in reduced deposition rate and extreme heating and destruction of Macroparticle Blocker 22 because the arc current is concentrated and travels through the plasma straight to Macroparticle Blocker 22 instead of around it. In an alternative embodiment not shown, the cathode may be positioned above the null point and the macroparticle blocker may be smaller in diameter, made of the same material as the cathode and thoroughly cooled, which may be advantageous for certain applications, such as using a smaller diameter cathode with a continuous feed mechanism that would allow operation for very long periods (such as days), for example. The concentrated plasma and extreme heating may also produce higher ionization of the plasma.

FIG. 1D also illustrates how the magnetic field created by Magnets 10 and 12 may provide for efficient ion transmission through the filter. Magnetic Field Lines 18 run from the top of Cathode 16 where the arc is confined, curve around Macroparticle Blocker 22 and through the open area between Outer Magnet 10 and Inner Magnet 12. The substantially concentric arrangement of Inner Magnet 12 and Outer Magnet 10 provides for a strong magnetic field (1000 Gauss+for example) because their respective magnetic fields combine constructively in the open space between them. The magnetic field is thereby strongest in the area where it is most needed for confining and transmitting plasma (electrons and ions) through curved trajectories around Macroparticle Blocker 22 (FIG. 1A) and through Filter-Duct 28 to Workpiece Area without intersecting Filter-Duct 28 or Baffling 32. In particular, according to plasma optics theory, electrons emitted at the arc spot follow the magnetic field lines, and ions follow the electrons. The magnetic field influences the motion of the ions directly also, but much less so than it controls electron motion because ions are much heavier than electrons. Electro-static fields more readily influence ion motion than magnetic fields. The relatively large currents of electrons inherent to the cathodic arc process and the susceptibility of these electrons to manipulation by magnetic fields is exploited in the present invention. The magnetic field acts to constrain the flow of electrons emitted from the cathode through the filter along the magnetic field lines, which creates an electrostatic field that guides the positive ions to the workpieces. Limiting cross-field motion of the electrons allows the electrostatic potential to build up in the system which in turn guides the ions. In addition though, strong magnetic fields, on the order of 1000 Gauss, may be strong enough to directly carry ions through the filter. The substantially concentric arrangement of magnets in the present invention creates a strong magnetic field in a compact device and provides for high flux ion throughput, whether ions follow the electrons or are guided directly. Experiment has indicated that ion transport efficiency and the resulting coating deposition rate, is directly related to magnetic field strength in an ion filter.

Figure 1E:
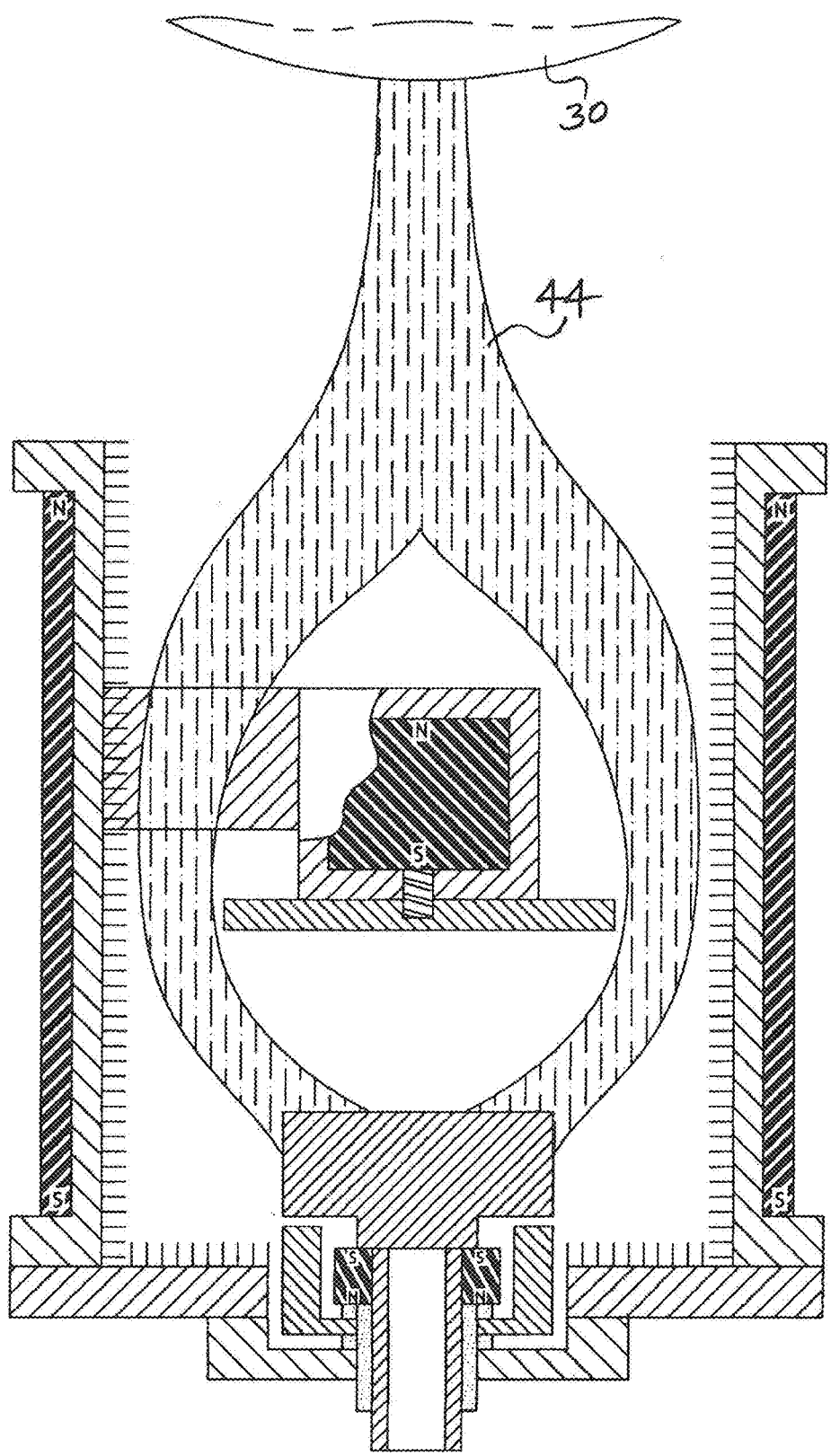
FIG. 1E illustrates plasma created by the embodiment depicted in FIG. 1A.
Figure 1F:
FIG. 1F is a photograph of the embodiment depicted in FIG. 1A in operation showing plasma exiting the filter.

A useful coating rate distribution may be provided for by the magnetic fields in the present invention. Referring to FIG. 1D, after curving around Macroparticle Blocker 22 and passing between Inner Magnet 12 and Outer Magnet 10, Magnetic Field Lines 18 curve back towards the axis at the exit of the device. Another magnetic field null area, Exit Null Ring 36 occurs here, before the lines then continues out towards Workpiece Area 30. Plasma 44 in FIG. 1E is a schematic illustration of the shape of the resulting plasma that follows the magnetic field lines (as previously described) past the exit out to Workpiece Area 30. The converging magnetic field lines that Plasma 44 follows produces a coating rate distribution relatively concentrated along the axis, at Workpiece Area 30. This may be useful for coating small diameter workpieces such as 2" diameter wafers (especially if they are located far away from the source), such as are often used in research and development. This way, coating is not wasted on areas where there is no need for it, optimizing coating rate and cathode usage. FIG. 1F is a photograph of the embodiment illustrated in FIG. 1 in operation, where it can be seen how plasma is focused and concentrated on the axis at the exit of the device.

Figure 2C:
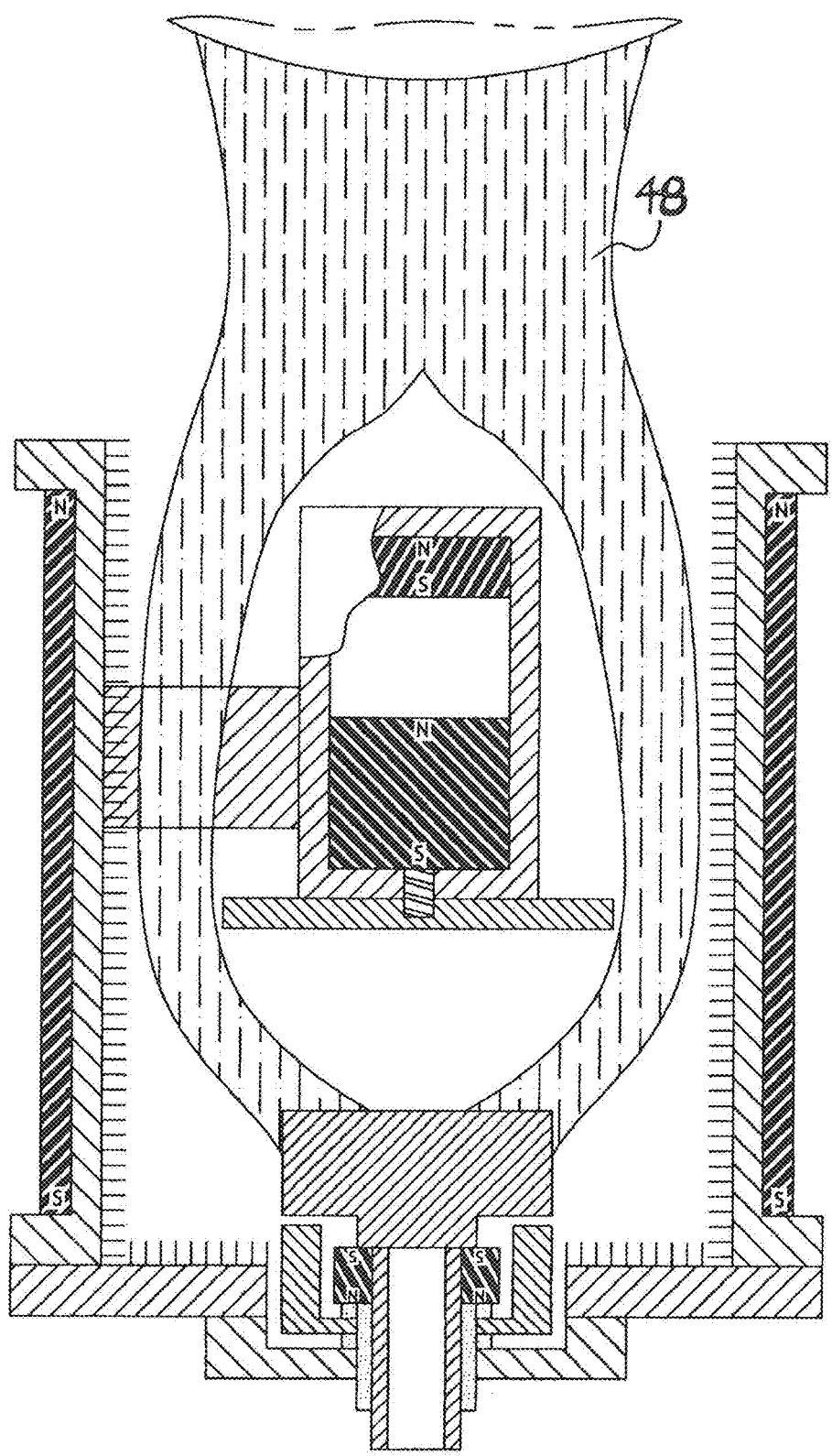
FIG. 2C illustrates plasma created by the embodiment depicted in FIG. 2A.
Figure 2D:
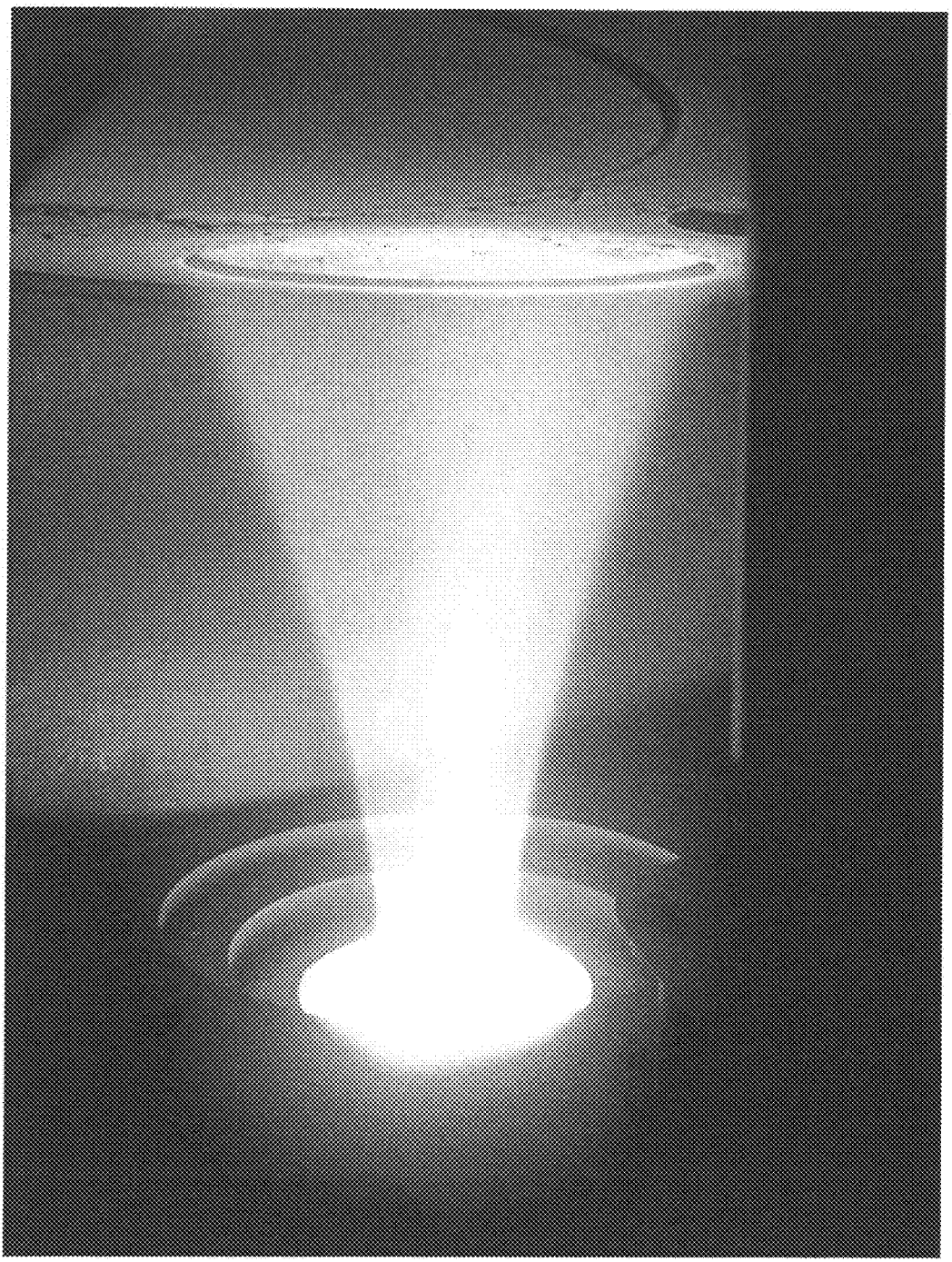
FIG. 2D is a photograph of the embodiment depicted in FIG. 2A in operation, showing the resulting diverging plasma.

Often, there is a need for a larger area coating rate distribution, for example coating larger commercial loads, a large die or a large number of drill bits. Referring to FIG. 2A, this larger area coating rate distribution may be enabled in the present invention by adding Exit Magnet 40 on the axis near the exit of Filter-Duct 28. In some embodiments, the amount of divergence may be controlled by the strength and position of Exit Magnet 40 along the axis: for instance, using a larger/stronger magnet or moving the magnet farther from Inner Magnet 12 causes more divergence and vice versa. The resulting magnetic field is shown in FIG. 2B where Magnetic Field Lines 41 are more divergent at the exit and Exit Null Ring 42 is larger in diameter than the magnetic field 18 and null ring 36 in FIG. 1D. FIG. 2C illustrates the resulting plasma distribution where Plasma 48 is more distributed compared to Plasma 44 in FIG. 1D. More distributed Plasma 48 results in a wider coating distribution (8" diameter versus 2" diameter, for example). FIG. 2D is a photograph of the source in operation showing the diverging plasma caused by adding Exit Magnet 40. It should be noted that in some embodiments, the same diverging effect may be obtained by extending the length of Inner Magnet 12 towards the exit. In another embodiment not shown, the magnetic field and the associated ion trajectories may be made to converge (instead of diverge) with Exit Magnet 40 in place by reversing the polarity of Exit Magnet 40 relative to Outer Magnet 12 and Inner Magnet 10. Thus, a unique advantage of the present invention is that one may modify the coating distribution by modifying the location, size or polarity of permanent magnets along the axis. This capability is significantly more difficult to implement using magnet coils. In some embodiments, Exit magnet 40 may be a strong, high temperature permanent magnet materials such as samarium-cobalt. In other embodiments, it may be a magnet coil or a soft-iron pole piece.

Reducing the overall size of the present invention (to a 6 inch duct outside diameter, for example) does not diminish and may improve performance. A smaller diameter provides for improved macroparticle filtering and a stronger magnetic field which increases ion transport efficiency and deposition rate. Although the source may be smaller, the plasma may diverge, providing a larger coating distribution, as previously described. A reduced diameter requires smaller or fewer magnets and may produce a stronger magnetic field. Macroparticle filtering is improved because the exit through which macroparticles escape to reach the workpieces is smaller. Also, using permanent magnets rather than magnet coils may allow for a more compact and simple device. The complication and expense of custom coil manufacturing and coil power supplies is eliminated, and the device may be operated using one low cost welder-like unfiltered arc. The present invention may allow for a simplified, symmetrical and compact device that is easier to deploy (to lift into place on the vacuum chamber, for example) and operate and less expensive to fabricate. Compact size combined with uniform deposition over larger areas may allow multiple filters of the present invention to be arranged linearly along one side of a vacuum chamber (FIGS. 5A-5D) or arranged in a spiral around all sides of the vacuum chamber in order to coat any desired length of workpieces.

Figure 3A:
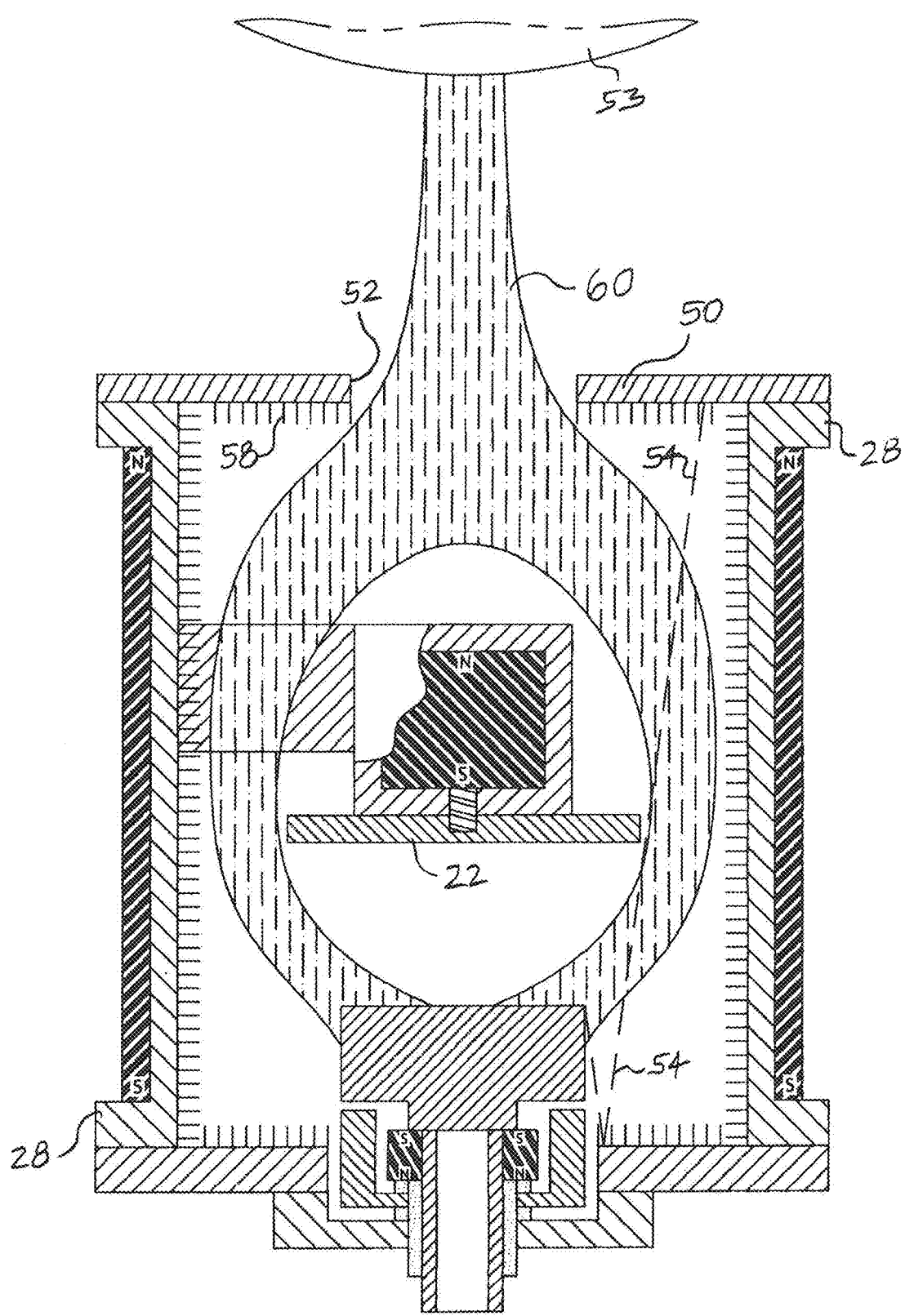
FIG. 3A is a schematic cross-section of another embodiment with a reduced aperture added to the exit of the filter-duct for improving macroparticle filtering, useable with the present invention.
Figure 3B:
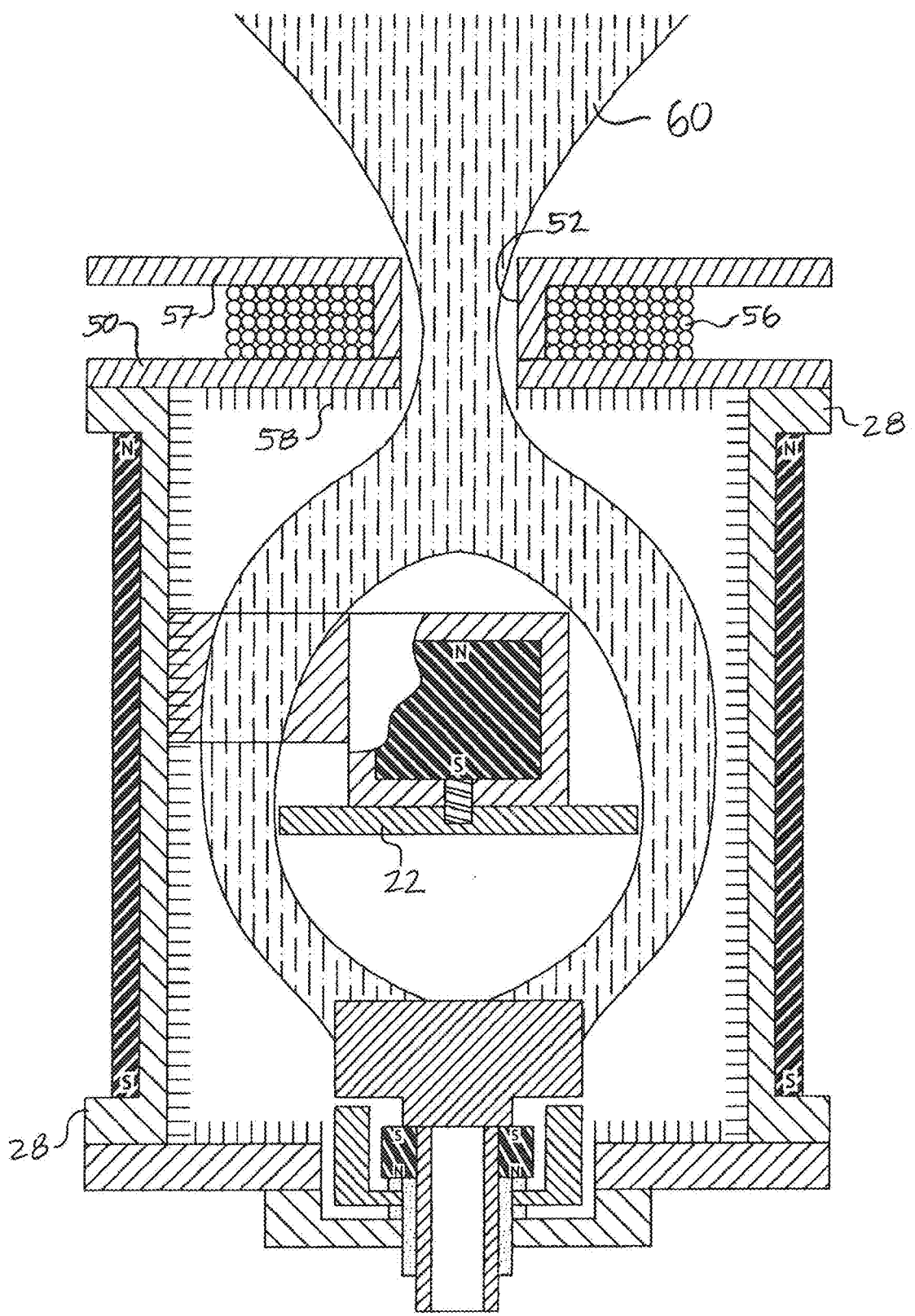
FIG. 3B is a schematic cross-sectional planar view of another embodiment with magnet coils around a reduced aperture added to the exit of the filter-duct for improving ion transmission through the aperture, useable with the present invention.
Figure 3C:
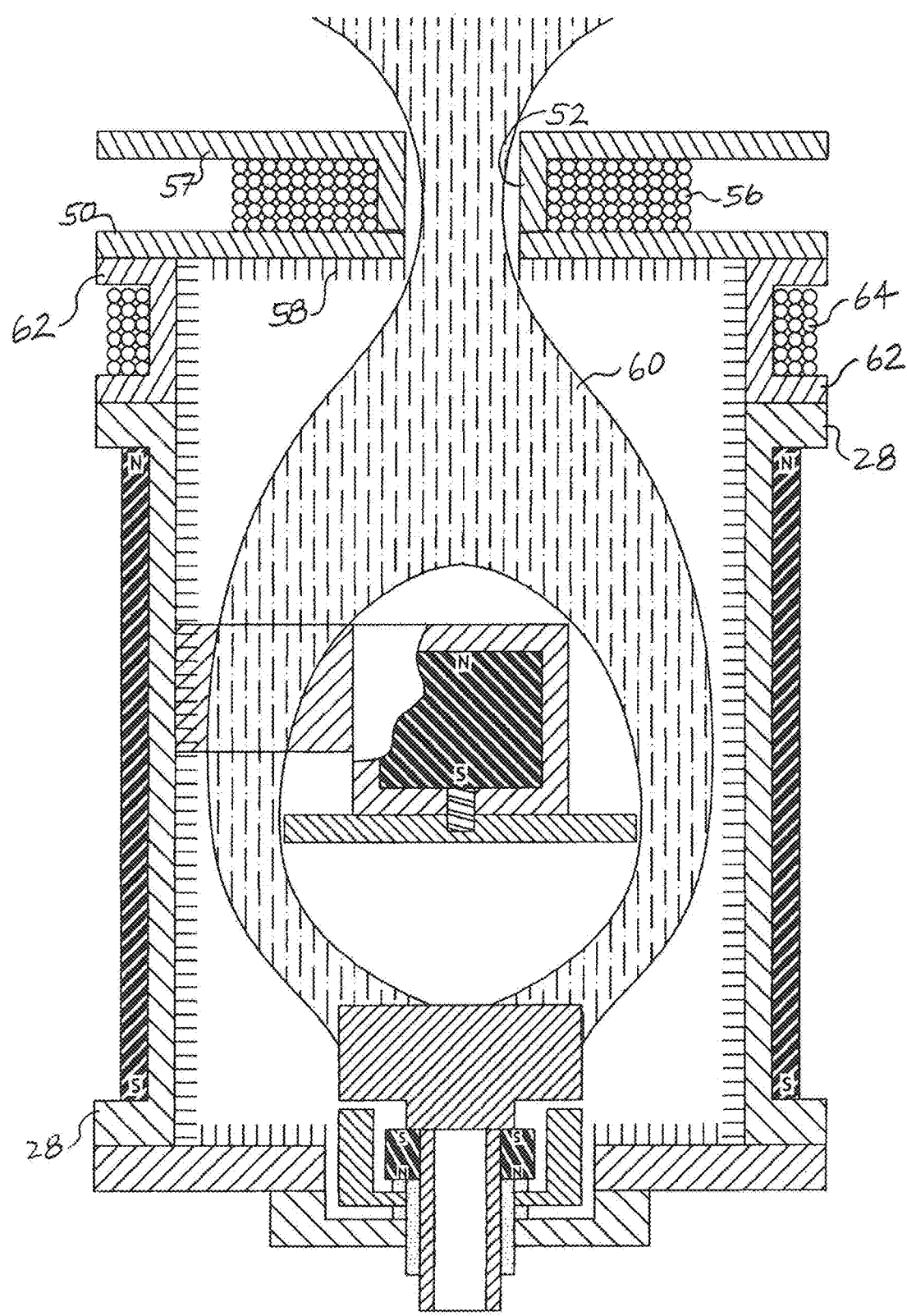
FIG. 3C is a schematic cross-sectional planar view of another embodiment with an extension added to the exit of the filter-duct for improving ion through-put, useable with the present invention.

To improve macroparticle filtering even further, especially for applications requiring extremely smooth films such as data storage (computer hard drive), electronic or optical coatings, and particularly when cathode materials that produce hard elastic macroparticles are used such as graphite for depositing DLC films, the embodiments illustrated in FIG. 3 may be used. In FIG. 3A, Aperture Plate 50 with Aperture 52, attached at the exit of Filter-Duct 28, may significantly reduce the likelihood that macroparticles exit the filter and reach workpiece area 53 because macroparticles may have to be reflected numerous times in order to pass through Aperture 52. Macroparticle 54 represents how one macroparticle travelling in a straight line, after one elastic reflection, could exit the filter and reach workpiece area 53 if Aperture Plate 50 were not present. In contrast, ions in Plasma 60 are guided through curved trajectories by the magnetic field, around Macroparticle Blocker 22 and back towards the axis at the exit of Filter-Duct 28 and may be carried through Aperture 52 and on to the workpieces. In some embodiments, Aperture Plate Baffling 58 may be added to improve Macroparticle catching. To maximize ion throughput, in some embodiments, a magnet arrangement that focuses the plasma along the axis (such as described above in reference to FIG. 1 and also shown again here in FIG. 3A) may be used to prevent the plasma from intersecting Aperture 52. Aperture 52 may be made larger or smaller (or non-round) than shown to accommodate various plasma distributions, or be integrated into the vacuum chamber flange of filter duct 28, rather than being a separate flange. Referring to FIG. 3B, to improve the transport of ions through Aperture 52, Aperture Magnet 56 may be positioned around Aperture 52 to further confine Plasma 60 through Aperture 52. In some embodiments, Aperture Magnet 56 may cause the magnetic field lines to diverge past the exit of the aperture, resulting in a wider coating rate distribution at the workpieces. In some embodiments, Aperture Magnet 56 may cause ions to be bent through a second trajectory before passing through Aperture 52. In some embodiments, Duct Extension 62 shown in FIG. 3C, may be employed to increase the distance between Aperture 52 and Filter-Duct 28 to provide more room for ions to be bent towards the axis before entering Aperture 52. Duct Extension Magnet 64 may be used to increase the strength of the magnet field at the exit of Filter-Duct 28 to further improve ion throughput. Aperture Magnet 56 may be a magnet coil (an electro-magnet), or may be a substantially ring-shaped permanent magnet or magnets or soft iron pole piece. Duct Extension Magnet 64 may be a permanent magnet or a magnet coil.

Figure 4A:
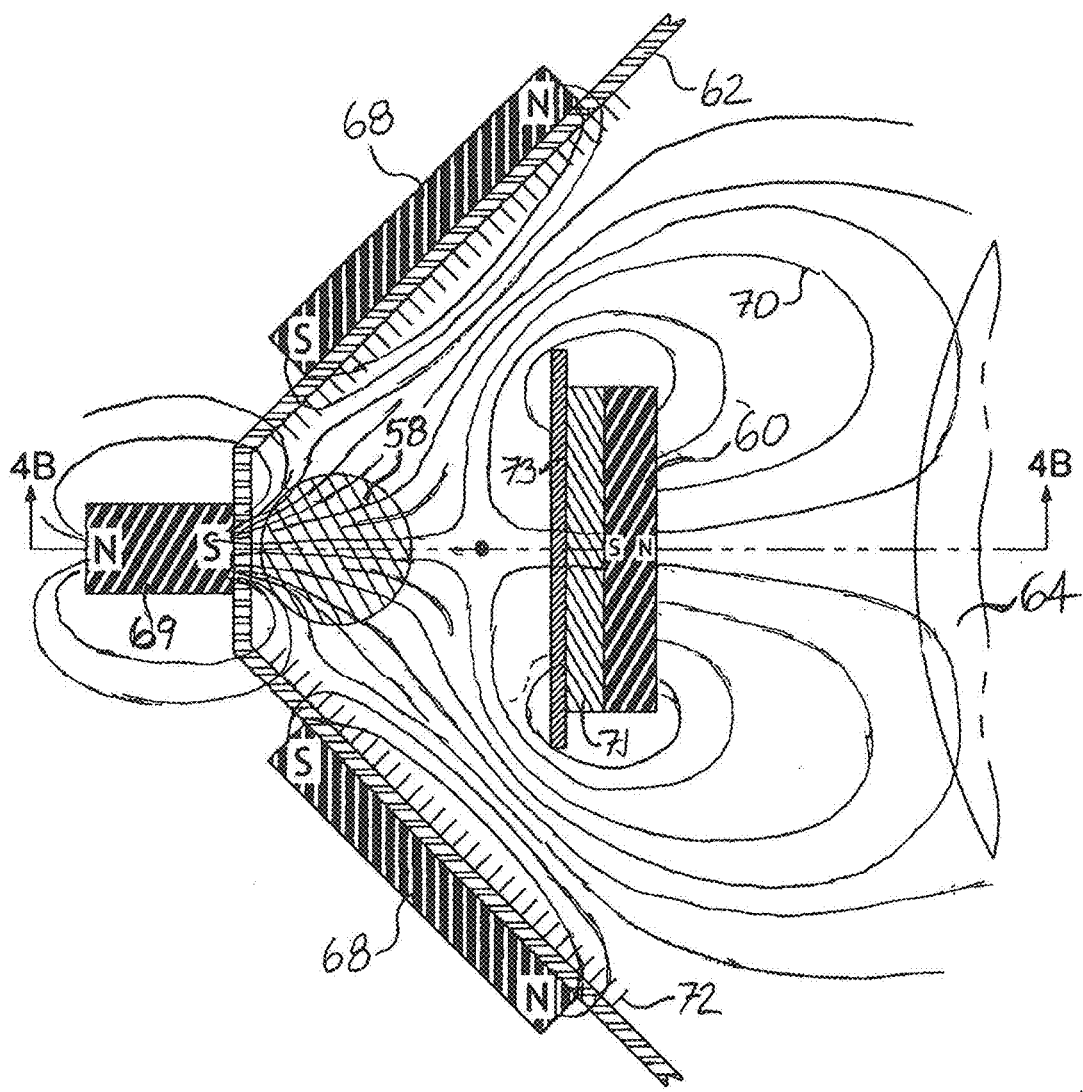
FIG. 4A is a schematic top cross-sectional view of an alternate embodiment of an ion source useable with the present invention.
Figure 4B:
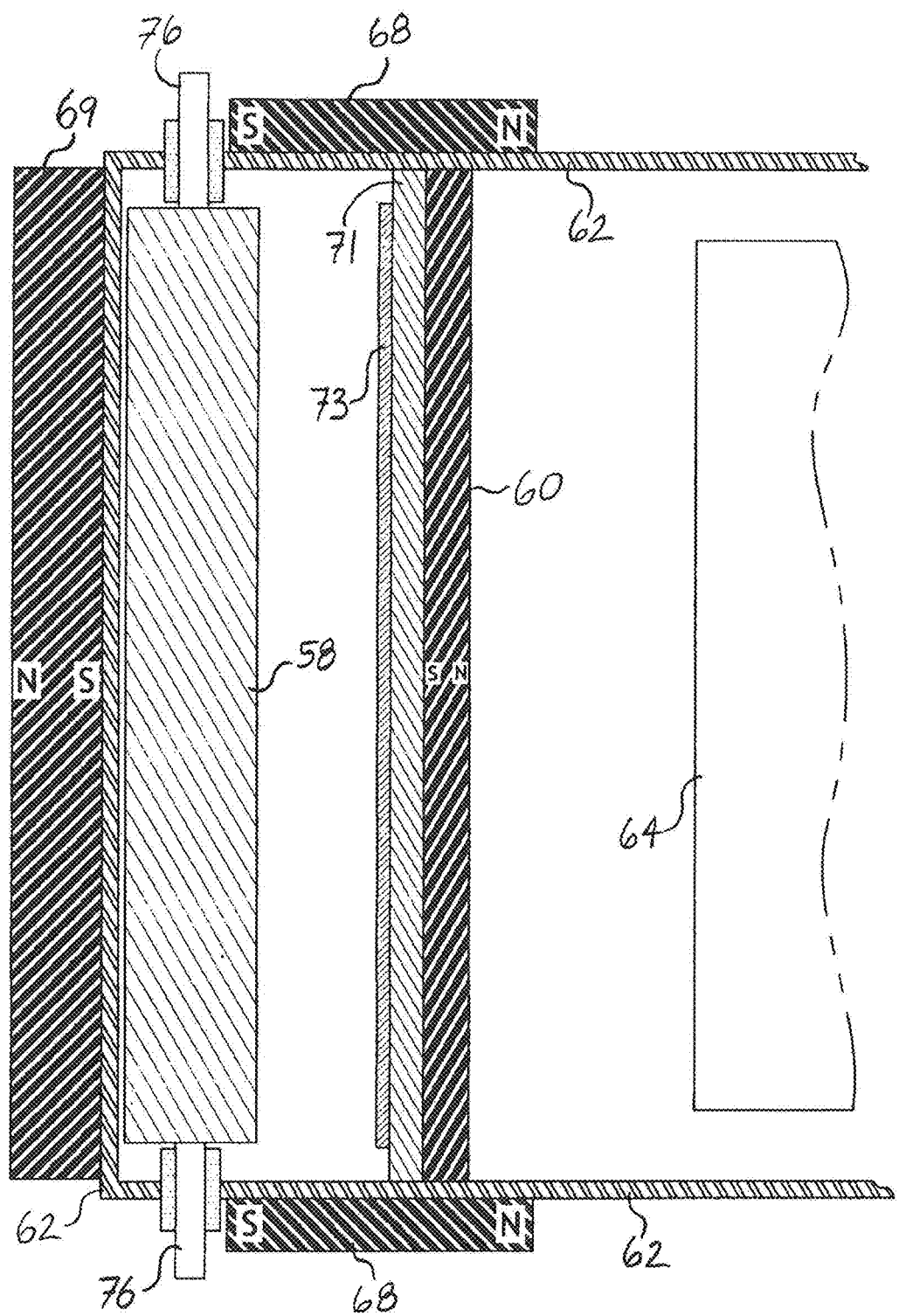
FIG. 4B is a schematic cross-sectional side view of the embodiment depicted by FIG. 4A.

It should be noted that cylindrical symmetry does not necessarily need to be maintained. In some embodiments, it may be desirable to use an elongated duct, cathode, magnets and aperture (rectangular, for example) for the purpose of providing an elongated coating area to suit efficient large scale industrial coating applications. Examples are shown in FIGS. 4A and 4B where an alternate, linear-type embodiment is illustrated. FIG. 4A is a partial top planar cross-sectional view and FIG. 4B is a schematic side planar cross-sectional view of the ion source illustrated in FIG. 4A. The ion sources of FIGS. 4A and 4B use a relatively large cylindrical Cathode 58 located in the corner of Vacuum Chamber 62. In this particular embodiment, the corner of Vacuum Chamber 62 represents a closed end of the ion source and Workpiece Area 64 represents an open area of the ion source. The evaporation surface of Cathode 58 is along the length of Cathode 58 that faces the open end of Vacuum Chamber 62 and towards Workpiece Area 64 wherein workpieces may be located for coating. In some embodiments, the line-of-sight between Cathode 58 and Workpiece Area 64 is blocked by Macroparticle Blocker 73, thereby preventing contamination of Workpiece Area 64 by macroparticles. Only one corner of Vacuum Chamber 62 is shown for simplicity. Other corners or ends may also contain ion sources such as the one depicted in FIG. 4A. In some embodiments, the walls of Vacuum Chamber 62 may be the anode. Vacuum Chamber 62 may be made of a nonmagnetic material such as stainless steel or aluminum. Inner Magnet 60 may be located between Cathode 58 and Workpiece Area 64 and may be mounted substantially along the length of Mounting Structure 71. Outer Magnet 68 may be arranged on the outside (or inside, in a alternate embodiment, not shown) of Vacuum Chamber 62 and may have a magnetic polarity that is substantially in the same direction as Inner Magnet 60. In some embodiments, Inner Magnet 60 and Outer Magnet 68 may be made of a rare earth neodymium-iron-boron material. Cathode Magnet 69, may be located behind Cathode 58, and may have a magnetic polarity substantially opposite to Inner Magnet 60 and Outer Magnet 68. Cathode Magnet 69 may act to pinch Magnetic Field Lines 70 behind Cathode 58 so that Magnet Field Lines 70 create an acute angle at the surface of the cathode that forces arc spots to the area of Cathode 58 that substantially faces Inner Magnet 60, an effect already explained in reference to FIGS. 1B and 1C. The corner of Vacuum Chamber 62 is shown flattened in order to accommodate locating Cathode Magnet 69 on the outside of Vacuum Chamber 62, however, the corner of the vacuum chamber may be left sharp and Cathode Magnet 69 may be located inside of Vacuum Chamber 62. Some embodiments may be operated without Cathode Magnet 69. Also, FIG. 4B shows Outer Magnet 68 present on the top and bottom surfaces of Vacuum Chamber 62 for clarity, but some embodiments may be operated with Outer Magnet 68 located on the sides of Vacuum Chamber 62 only, as is represented in FIG. 4A. Macroparticle Blocker 73 and Inner Magnet 60 may be mounted to Mounting Structure 71 by means not shown, such as bolts. Mounting Structure 71 and Vacuum Chamber 62 may be water cooled (not shown).

In some embodiments, the arc, initiated by triggering means runs along the length of Cathode 58 (best seen in FIG. 4B) substantially on the side that faces Magnet 60. The magnetic field generated by Inner Magnet 60 and Outer Magnet 68 and (optionally) Cathode Magnet 69 contains the arc here, then directs plasma generated at the cathode through the open area between Outer Magnet 60 and Inner Magnet 68 to Workpiece Area 64. Ions are extracted from the cathode region, sent around Inner Magnet 60 through where there is a large open area for ion passage between Inner Magnet 60 and Outer Magnet 68, and then bent back through curved trajectories towards Workpiece Area 64 in a spread out uniform pattern. Large currents of ions may be guided through curved trajectories while macroparticles traveling from the cathode are reflected through prohibitively abrupt angles to reach Workpiece Area 64 and are instead caught in Baffles 72 mounted on the walls of Vacuum Chamber 62 or blocked by Macroparticle Blocker 73. Macroparticle Blocker 73 may be made of a high temperature material such as graphite and made removable for replacement or cleaning of coating buildup. In some embodiments, Baffles 72 are in the form of ribs or fins arranged substantially perpendicular to the expected macroparticle trajectories, to catch macroparticles and/or prevent them from bouncing from the walls of Vacuum Chamber 62 into Workpiece Area 64. In some embodiments, graphite or a high temperature honeycomb material, for example, may be used for Baffles 72. In some embodiments, Baffles 72 and Macroparticle Blocker 63 may be removable from Vacuum Chamber 62 for replacement or cleaning.

With reference to FIG. 4B, cathode 58 may be mounted to electrically isolated, rotary cathode Feed-throughs 76 that extend into Vacuum Chamber 62. After the arc is triggered, the arc may travel towards the end of the cathode that is connected to the negative side of the power supply (not shown). In some embodiments, the negative side of the power supply may be switched back and forth between the two ends of Cathode 58 to cause the arc to travel back and forth along the length of Cathode 58. Adjustably positioned proximity sensors (not shown) may be disposed adjacent the two ends of Cathode 58 to sense the presence of the arc and cause a switching circuit to change the power supply connection from one cathode end to the other. Efficient use of Cathode 58 may be provided by rotating the cathode around its axis. Cathode 58 may be rotated continuously or periodically during arc operation. The arc may remain on the side of the cathode facing Inner Magnet 60 while Cathode 58 rotates beneath the arc, eroding spiral paths along the surface of rotating Cathode 58 and thereby over time, substantially consuming the outer surface of Cathode 58 to provide maximal cathode material usage before it must be replaced. The rotation may cause the arc spots to move more quickly across the cathode surface, thereby reducing the production of macroparticles at their source. This effect may be maximized my rotating the cathode at high velocity. In an alternate embodiment, Cathode 58 may be constructed of different materials whereby rotating the cathode to align the desired evaporation material beneath the arc track allows the formation of multilayer structures or coatings on the workpieces. A cathode that has one or more flat evaporation surfaces instead of a cylindrical shape may also be used. Cathode 58 may be in the form of a hollow tube for the purpose of providing internal water cooling via lines or tubes that extend into the hollow center of Cathode 58 and may be connected with an externally located coolant supply (not shown). The outside diameter of Cathode 58 may be 5.1 cm and the inside diameter may be 1.3 cm for example.

In another embodiment not shown, arc motion up and down the length of the cylindrical cathode may be provided for by moving the inner magnet and/or the cathode magnet up and down the length of the cathode using mechanical means where the arc is magnetically confined to follow the motion of the magnet(s). The inner magnet and the cathode magnet may be reduced in size, rather than substantially covering the length of the cathode (as is shown in FIG. 4B), to provide room for their motion. The inner magnet and/or cathode magnet and/or outer magnet may also be magnet coils. In some embodiments, these magnet coils may be arranged to scan the arc up and down the cathode electrically instead of mechanically.

Referring now to FIGS. 5A-5D compact size allows multiple filters in the invention to be arranged linearly along one side of a vacuum chamber or arranged around the sides of the vacuum chamber (helically, for example) in order to coat any desired length of workpieces. Furthermore, as illustrated in FIGS. 5A-5D, multiple filters may be arranged so that adjacent filters have opposite polarity and the magnetic field lines link adjacent filters, so as to substantially contain plasma produced by the filters. This arrangement may substantially trap charged particles generated in the system which in turn guides ions to and increases ionization within the workpiece area. The linking of the magnetic fields may also promote uniform coating on larger substrates.

Figure 5A:
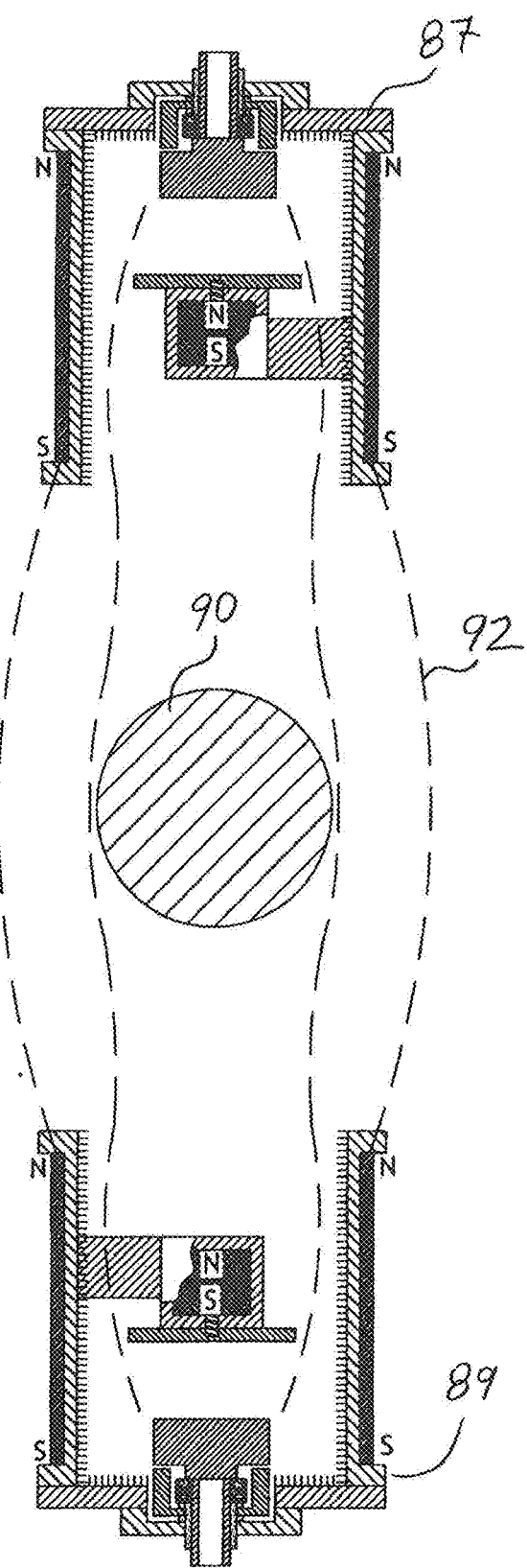
FIG. 5A schematically illustrates a filtered ion source system comprising two filtered ion sources and illustrating an arrangement of magnetic polarities in accordance with the invention.

FIG. 5A illustrates an embodiment of the present invention that includes two ion sources, Source 87 and Source 89, with magnetic poles reversed relative to each other, positioned opposite each other with Workpieces Area 90 located between them. The sources are mounted to a vacuum chamber. Magnetic Field Lines 92 from the two sources link up across the interior of the vacuum chamber and substantially around and through Workpiece Area 90. This arrangement may substantially contain the plasma within Workpiece Area 90 and promote ionization and deposition rate and uniformity there.

Figure 5B:
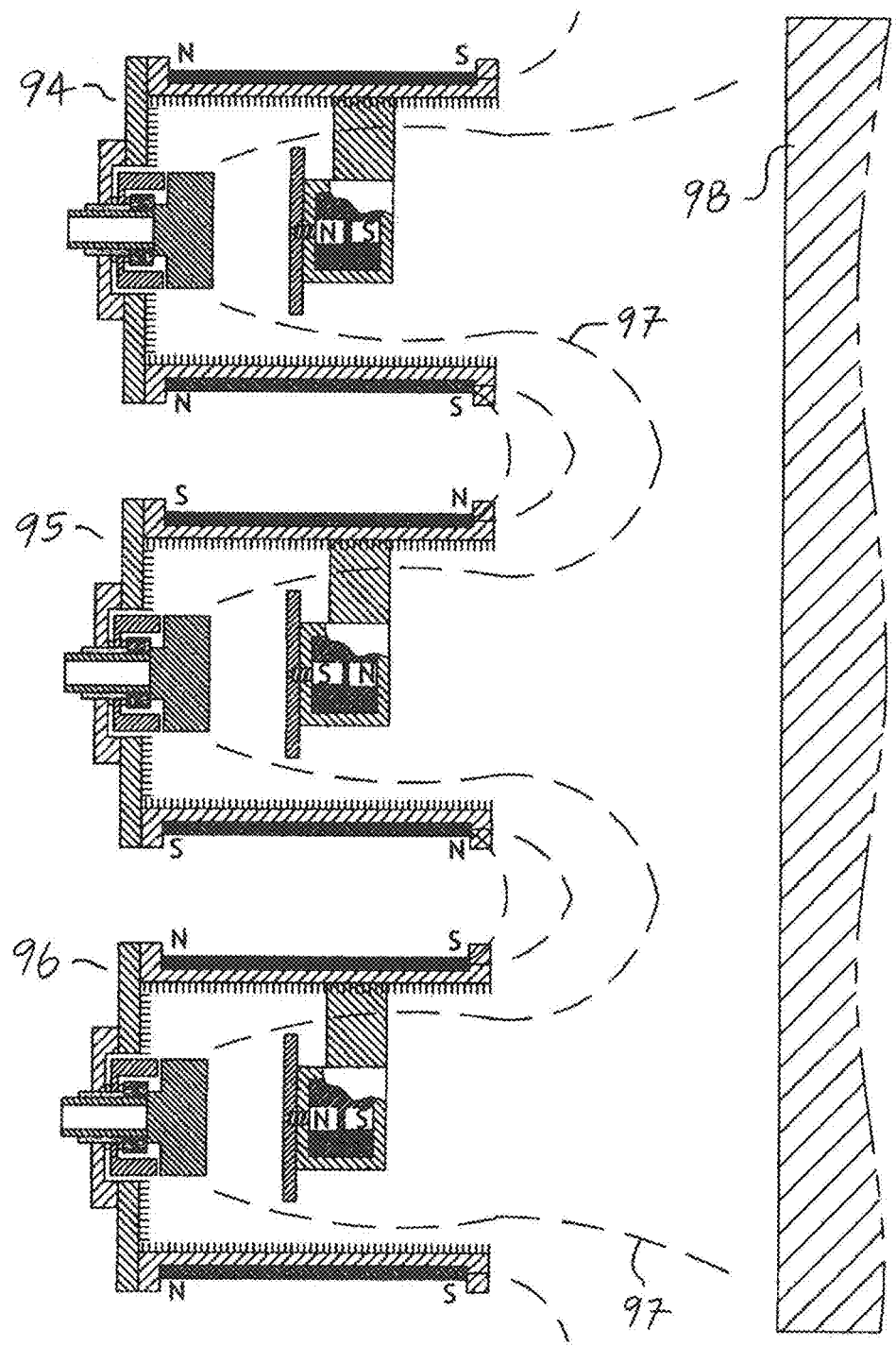
FIG. 5B schematically illustrates another system and shows the arrangement of magnetic polarities when three filtered ion sources are placed side by side, useable with the present invention.

FIG. 5B illustrates another embodiment of the present invention that includes three Ion Sources, 94, 95 and 96, arranged adjacent to each other, on one side of a vacuum chamber for example, such that adjacent filters have opposite polarity so that Magnetic Field Lines 97 link adjacent filters. This promotes ionization, coating rate and uniformity on larger substrates—on Substrate 98, for example.

Figure 5C:
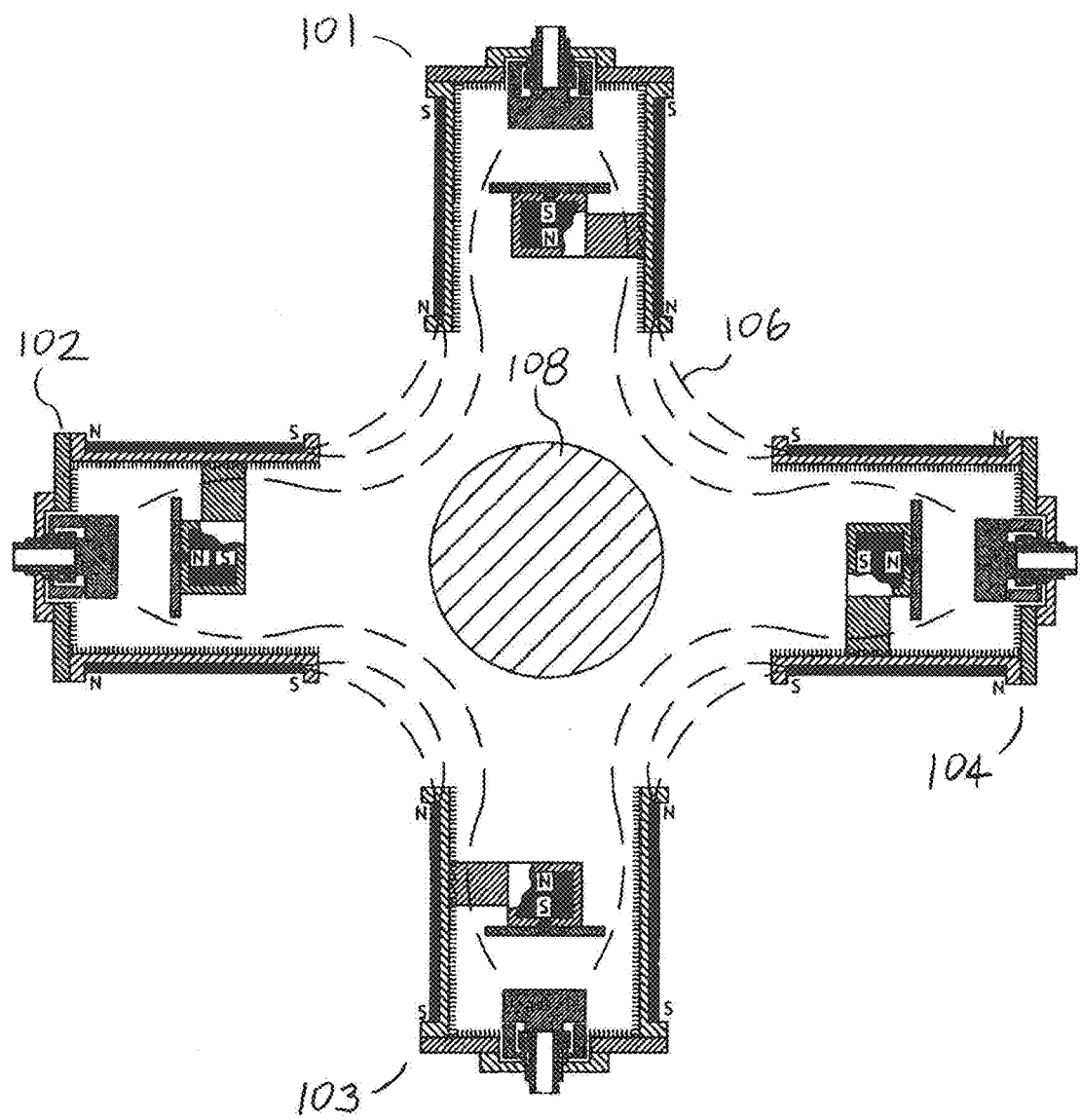
FIG. 5C schematically illustrates another system and shows the arrangement of magnetic polarities when four filtered ion sources are arranged around a center workpiece area, useable with the present invention.

FIG. 5C illustrates an embodiment of the present invention that includes four Sources 101, 102, 103 and 104 arranged on four walls of a vacuum chamber (not shown) with adjacent sources having opposite magnetic polarity such that their fields, depicted by dashed Magnetic Field Lines 106, link up around Workpiece Area 108.

Figure 5D:
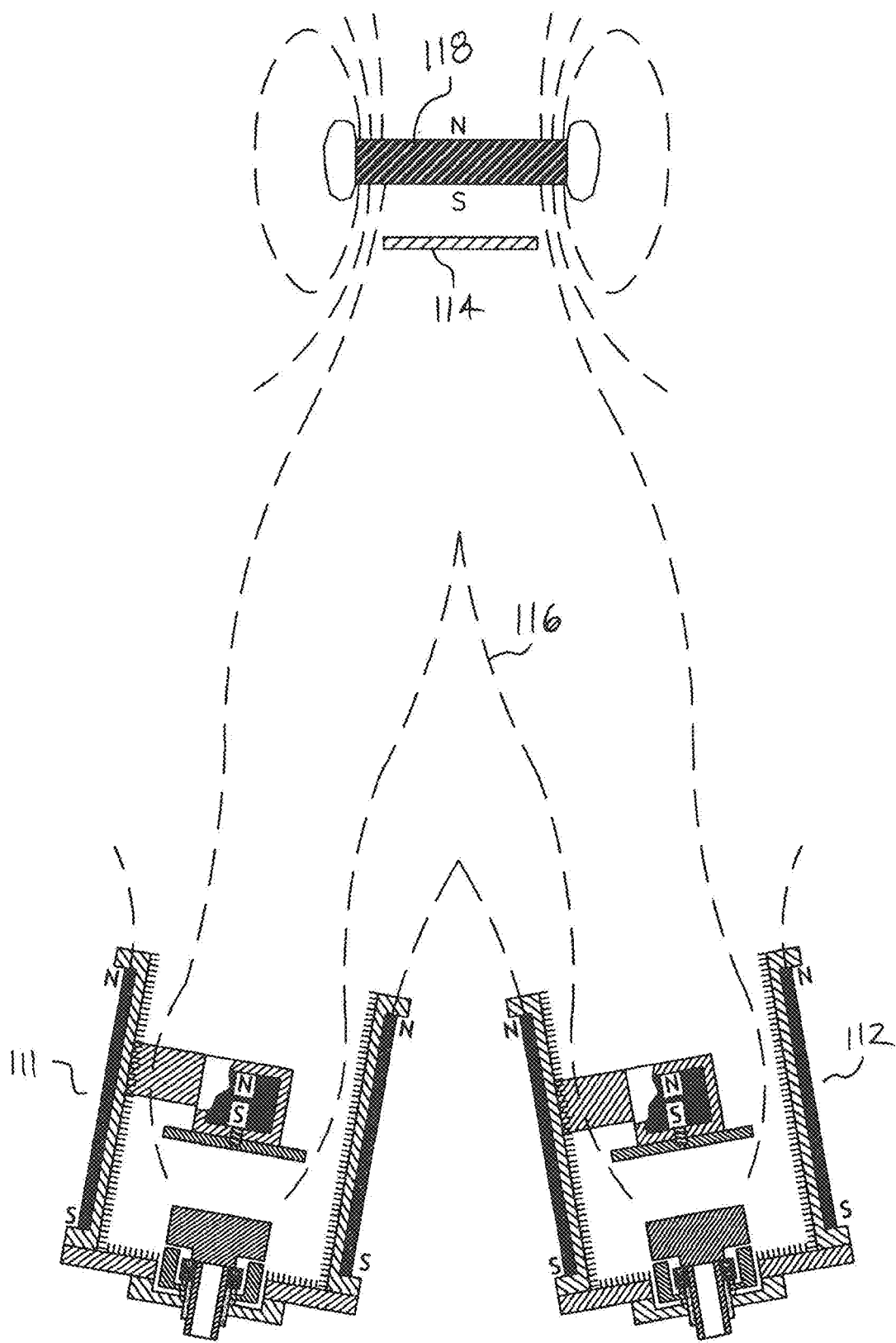
FIG. 5D schematically illustrates another system and shows the arrangement of magnetic polarities when two filtered ion sources are arranged next to each other and directed confocally towards the same area where workpieces can be positioned for co-deposition of coatings, useable with the present invention.

FIG. 5D illustrates still another embodiment of the present invention that includes two sources arranged next to each other, Source 111 and Source 112, having the same magnetic polarity and angled confocally towards Workpiece Area 114, which can hold a silicon wafer, for example. Magnetic Field Lines 116 may be made to link up across the vacuum chamber and combine at Workpiece Area 114 by Magnet 118, which has magnetic polarity substantially the same as Sources 111 and 112. This is useful for creating alloys of different coating materials, titanium-aluminum, for example. Although only two ion sources are shown, three or more may be arranged similarly, to coat the same substrate.

The above specification, examples, and data provide a complete description of the composition, manufacture, and use of the invention. Since many embodiments of the invention can be made without departing from the spirit and scope of the invention, the invention resides in the claims hereinafter appended.

The embodiments of the invention in which an exclusive property or privilege is claimed are defined as follows:

1. A filtered ion source comprising:
    a first end and a second end, wherein the first end is closed and the second end is open to a work area;
    a consumable electrode source material comprising an evaporation surface facing the second end, the consumable electrode source material having a cross-sectional length;
    a first permanent magnet disposed between the consumable electrode source material and the work area
    a first persistent magnetic field between the evaporation surface and the work area
    a shielding surface having a first end and a second end and positioned to leave a first space adjacent to said first end of the shielding surface and a second space adjacent to said second end of the shielding surface, the first space and the second space sized to permit the passage of at least one macroparticle, the shielding surface disposed between the first permanent magnet and the consumable electrode source material, the shielding surface facing the evaporation surface and having a cross-sectional length that is equal to or greater than the cross-sectional length of the consumable source material;

a second permanent magnet disposed concentrically around the first permanent magnet a second persistent magnetic field between the evaporation surface and the work area, wherein the magnetic moment of the first permanent magnet and the magnetic moment of the second permanent magnet are aligned;

a third permanent magnet disposed underneath the evaporation surface, the third permanent magnet having a reverse polarity relative to the first persistent magnetic field and the second persistent magnetic field; and a null point disposed between the evaporation surface and the first permanent magnet.

2. The filtered ion source of claim 1, further comprising a duct extension disposed between the first permanent magnet and the aperture, wherein the duct extension increases the distance between the first permanent magnet and the aperture.

3. The filtered ion source of claim 2, further comprising an additional magnet, wherein the additional magnet and the duct extension are concentric with one another.

* * * * *